United States Patent
Knüpfer

(10) Patent No.: US 6,924,680 B2
(45) Date of Patent: Aug. 2, 2005

(54) DLL CIRCUIT FOR STABILIZATION OF THE INITIAL TRANSIENT PHASE

(75) Inventor: Bernhard Knüpfer, Otterfing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/780,284

(22) Filed: Feb. 17, 2004

(65) Prior Publication Data

US 2004/0222830 A1 Nov. 11, 2004

(30) Foreign Application Priority Data

Feb. 18, 2003 (DE) ......................................... 103 06 619

(51) Int. Cl.$^7$ ............................................... H03L 7/06
(52) U.S. Cl. ..................................... 327/158; 327/149
(58) Field of Search ................................. 327/141–142, 327/147, 149, 152–153, 156, 158, 161

(56) References Cited

U.S. PATENT DOCUMENTS

| | | | |
|---|---|---|---|
| 6,316,976 B1 | 11/2001 | Miller, Jr. et al. | |
| 6,337,590 B1 | 1/2002 | Millar | |
| 6,351,167 B1 * | 2/2002 | Hein et al. | 327/158 |
| 6,417,706 B2 * | 7/2002 | Kondo | 327/158 |
| 6,456,129 B1 | 9/2002 | Tsukude | |
| 6,492,922 B1 * | 12/2002 | New | 341/120 |
| 6,586,978 B2 * | 7/2003 | Stief | 327/158 |
| 6,741,507 B2 * | 5/2004 | Iwamoto | 365/194 |

FOREIGN PATENT DOCUMENTS

| | | |
|---|---|---|
| DE | 199 30 167 | 1/2001 |
| DE | 101 20 764 | 11/2002 |

* cited by examiner

Primary Examiner—Timothy P. Callahan
Assistant Examiner—Cassandra Cox
(74) Attorney, Agent, or Firm—Moser, Patterson & Sheridan, L.L.P.

(57) ABSTRACT

A DLL circuit for phase matching of a periodic input signal, having a variable delay unit, having a delay element and having a regulation unit which has a regulation device, for setting an input signal delay in the delay unit, and a comparator unit, in order to generate a phase signal in each signal cycle, the state of which phase signal indicates that the input signal is leading or lagging a signal which has been delayed by the variable delay unit and the delay element, and which is provided to the regulation device during a steady-state operating phase, with the regulation device increasing the delay of the delay unit during an initial transient phase until a change in the phase signal indicates a change from identified lagging of the input signal to leading of the input signal, wherein the regulation unit has a filter circuit in order to provide a filtered phase signal to the regulation device during the initial transient phase, with the filter circuit changing the state of the filtered phase signal to the state of the phase signal only when a different state of the phase signal with respect to the state of the filtered phase signal has been detected for a predetermined number of successive signal cycles.

20 Claims, 1 Drawing Sheet

DLL CIRCUIT FOR STABILIZATION OF THE INITIAL TRANSIENT PHASE

CROSS-REFERENCE TO RELATED APPLICATIONS

This application claims foreign priority benefits under 35 U.S.C. §119 to co-pending German patent application number 103 06 619.5-35, filed Feb. 18, 2003. This related patent application is herein incorporated by reference in its entirety

BACKGROUND OF THE INVENTION

1. Field of the Invention

The invention relates to methods and circuits for phase matching of a periodic input signal, with reduced sensitivity to disturbances during an initial transient phase.

2. Description of the Related Art

DLL circuits (delay locked loops) are used in order to produce signals which are intended to have a fixed phase difference with respect to a given periodic input signal. DLL circuits such as these are frequently used in clock signal lines in integrated circuits, in order to compensate for the propagation time delay on the clock signal line. In the case of a delayed clock signal, the DLL circuit then adds a further delay to the clock signal, so that a phase-matched signal is produced at the output of the DLL circuit, with this phase-matched signal being delayed by one clock period or by a multiple of a clock period with respect to the original undelayed clock signal. In this way, it is possible to provide an undelayed clock signal at the output if, for example, the signal propagation time on the signal path of the clock signal is known at every point in the integrated circuit as far as the DLL circuit.

The accuracy of the phase matching depends on how accurately the previous delay of the clock signal can be modeled with the aid of a replication in the form of a delay element.

A DLL circuit typically has a variable delay unit, which is set via a regulation unit. The regulation unit also has a comparator unit, which compares the periodic signal and the input signal which has been delayed via the variable delay unit and the delay element with one another, and generates a phase signal which indicates whether the input signal is leading or lagging. In the steady state, the phase signal indicates whether the delay of the variable delay unit should be incrementally increased or reduced.

In an initial transient phase, for example shortly after the DLL circuit has been switched on, a steady state must first of all be found, in which the input signal and the signal which has been delayed by the delay unit and the delay element essentially have a phase angle of 0°, or are oscillating around a phase angle of 0°. As the initial state, a specific delay is set in the variable delay unit, in which case, if a lead is identified, this does not indicate whether the phase angle of 0° can be achieved reliably by reducing the delay in the delay unit. For this reason, the delay in the variable delay unit is increased continuously in the initial transient phase, independently of the phase signal, with greater increments than in the steady state. If it is found, after having previously identified that the input signal is leading, that the input signal is now lagging, then the phase angle of 180° has been reached. If a lead is detected after a lag, then the phase angle of 0° has been reached, the initial transient phase is ended, and a change is made to the normal operating state.

When the phase signal changes at a phase angle of 180°, it is possible in the event of disturbances for a lead to be identified once again after a change has been identified from a lead to a lag, so that the regulation unit incorrectly assumes that the phase angle of 0° has already been reached. This leads to a change in the regulation to the normal operating mode, in which the delay in the delay unit is changed with considerably smaller increments than in the initial transient phase, so that it takes a very long time to set the phase angle to 0°. As a result, it may not be possible to reach a maximum initial transient time that is stipulated according to a specification.

SUMMARY OF THE INVENTION

The object of the present invention is therefore to provide a DLL circuit with reduced sensitivity to disturbances, and a method for phase matching of a periodic input signal for a DLL circuit, in which stabilization at a phase angle of 0° can be achieved quickly.

According to a first aspect of the present invention, a DLL circuit is provided for phase matching of a periodic input signal. The DLL circuit has a variable delay unit, a delay element and a regulation unit. The regulation unit has a regulation device, for setting an input signal delay in the delay unit, and a comparator unit. In each signal cycle, the comparator unit generates a phase signal whose state indicates that the input signal is leading or lagging a signal which has been delayed by the variable delay unit and the delay element, and which is provided to the regulation device during a steady-state operating phase. During an initial transient phase, the regulation device increases the delay of the delay unit until a change in the phase signal indicates a change from identified lagging of the input signal to leading of the input signal. The regulation unit also has a filter circuit in order to provide a filtered phase signal to the regulation device during the initial transient phase. The filter circuit changes the state of the filtered phase signal to the state of the phase signal only when a different state of the phase signal with respect to the state of the filtered phase signal has been detected for a predetermined number of successive signal cycles.

The DLL circuit according to the invention has the advantage that the phase signal is provided only in filtered form to the regulation device in the initial transient phase. This has the advantage that, when the phase angle is changing from a lead to a lag, that is to say at a phase angle of 180°, no lead is detected in the event of disturbances after a lag has been identified, which would incorrectly lead to identification of the phase angle of 0°. This would result in the initial transient phase being ended, after which a change is made to regulation for a steady-state operating phase. This regulation in the steady-state operating phase results in the delay in the delay unit being changed with very small increments, so that, starting from a real phase angle of 180°, the phase angle of 0° is reached only very slowly.

A disturbance which can lead to incorrect identification of a phase angle of 0° may be caused by a sudden phase change induced by noise, by regular phase disturbances, or by the occurrence of jitter. In the event of jitter, the position of a flank of the periodic input signal is offset in time, so that the time shift can lead to incorrect identification of the phase angle when the phase angle is close to 180°. In order to avoid this, the phase signal is filtered, so that the phase signal for the regulation device, which governs the change to the steady-state operating phase, is changed only after reliable identification of a change in the phase angle over a number of successive signal cycles. This means that a spurious phase signal value which occurs once, for example when a lag is identified on one occasion while a lead is being identified, with a lead subsequently being identified once again after the identified lag, can be ignored. Normally, the transition from an identified lag to an identified lead would signal the phase angle of 0° and would cause the regulation unit to switch to the normal operating phase. The filter circuit now first of all results in a wait for a predetermined number of signal cycles until a phase signal which is not the same as the output signal from the filter circuit, that is to say the filtered phase signal, occurs a number of times successively, before the state of the filtered phase signal is passed on to the regulation device.

It is also possible to provide for the predetermined number of successive signal cycles to be variable. In particular, it is possible to provide for the predetermined number of successive signal cycles to be chosen such that the signal delay between the input signal and the delayed signal is equal to or less than the multiple of the cycle time determined by this number. A time shift in one flank resulting from jitter can lead to an incorrect identification of the phase angle twice in the comparator device. The first occasion may be identified as a faulty phase angle when the time-offset flank of the input signal is compared with the fed-back delayed signal in the comparator device. However, the time offset of the flank is likewise passed on delayed in time to the comparator device via the feedback, so that the disturbed flank is applied to the comparator device for a second time after a delay time which is predetermined by the variable delay unit and the delay element. Provision is therefore made for the filter circuit to check at least a number of clock cycles of the phase signal until a disturbed flank of the input signal has also been applied to the comparator device after the delay produced by the delay unit and the delay element.

Provision is preferably made for the filter circuit to have a shift register with a predetermined number of registers, with the phase signal being applied to the shift register, and with the filtered phase signal changing state only when a different state than the state of the phase signal is stored in all of the shift registers.

It is also possible to provide for the filter circuit to have an SR flipflop whose set input is connected to the output of an AND gate, and whose reset input is connected to the output of a NOR gate, with the outputs of the registers in the shift register being connected to inputs of the AND gate and to inputs of the NOR gate. This means that the SR flipflop stores the phase signal and changes its state only when the phase signals indicate a changed phase signal in a number of successive signal cycles. The number corresponds to the number of registers in the shift register.

According to a further aspect of the present invention, a method is provided for phase matching of a periodic input signal during an initial transient phase of a DLL circuit. A phase signal which indicates that the input signal is leading or lagging a delayed signal is generated in each signal cycle. The delay of the delayed signal is varied on the basis of the phase signal. The delay of the delayed signal is increased incrementally during the initial transient phase. The phase signal is filtered during the initial transient phase, with the state of the filtered phase signal changing only when a different state of the phase signal with respect to the state of the filtered phase signal has been detected for a predetermined number of successive signal cycles.

According to the invention, disturbances which incorrectly indicate a changed phase angle may be filtered out. A change in state is passed on from the filter circuit to the regulation device only when a change in the phase angle from a lead to a lag or from a lag to a lead is identified on the basis of repeated identification of the changed state of the phase signal. This avoids incorrect identification of a phase signal of 0° leading to the end of the initial transient phase. If this is done too early, then the DLL circuit has to reach the phase angle of 0° in the steady-state operating phase. This is highly time-consuming, since the delay during the normal operating phase is changed incrementally with smaller increments than is the case during the initial transient phase.

BRIEF DESCRIPTION OF THE DRAWINGS

One preferred embodiment of the invention will be explained in more detail in the following text with reference to the attached drawings, in which.

DETAILED DESCRIPTION OF THE PREFERRED EMBODIMENT

Figure 1:
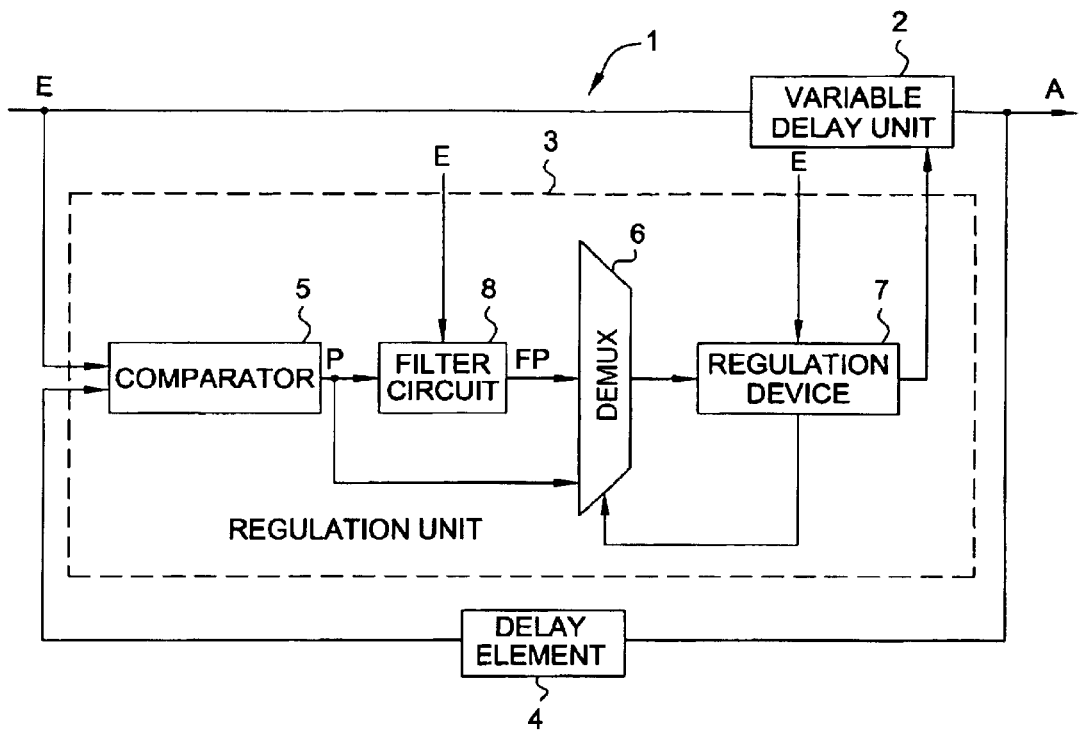
FIG. 1 shows a block diagram of a DLL circuit according to one preferred embodiment of the invention.

FIG. 1 shows a DLL circuit 1 with a variable delay unit 2, which is connected to a regulation unit 3. The input of the DLL circuit 1 is connected to one input of the variable delay unit 2, and to a first input of the regulation unit 3. An output of the variable delay unit 2 represents the output A of the DLL circuit 1. The output A of the DLL circuit 1 is connected via a delay element 4 to a second input of the regulation unit 3.

The purpose of the DLL circuit 1 is to shift a periodic signal which is applied to the input E forward by a delay which is predetermined by the delay element 4. A DLL circuit 1 such as this may be used in particular for clock signal lines in an integrated circuit, in order to compensate for the delays which result from the signal propagation times on the clock lines. In a situation such as this, the delay element 4 will be matched in order to simulate the delay of a clock signal on a clock line, such that the corrected clock signal, which is not delayed with respect to the original clock signal, is produced at the output A of the DLL circuit 1.

The regulation unit 3 has a comparator device 5 which compares the input signal that is applied to the first input and the output signal (which has been delayed via the delay element 4) from the output A of the DLL circuit 1 with one another, and emits a phase signal P at an output, indicating that the input signal is leading the delayed output signal, or is lagging it.

The phase signal P is applied to a first input of a demultiplexer device 6. One output of the demultiplexer device 6 is connected to a regulation device 7 for the regulation unit 3. A regulation device 7 controls the demultiplexer device 6 such that, in a steady-state operating phase, the phase signal P is passed on through the demultiplexer device 6 to the regulation device 7. In the steady-state operating phase, if the phase signal P indicates a lead, the variable delay unit 2 which is connected to the regulation device 7 incrementally increases the delay of the input signal. On the other hand, if the phase signal P indicates a lag, the delay in the variable delay unit 2 is reduced. In this way, a phase angle between the periodic input signal at the input E and the signal which has been delayed by the delay unit 2 and the delay element 4 is regulated at approximately 0°.

In an initial transient state (which is assumed, for example, after switching on the DLL circuit 1), the regulation device 7 controls the variable delay unit 2 such that the delay is increased continuously in delay increments. The initial transient phase lasts until the regulation device 7 identifies a transition from a lagging input signal to a leading input signal, as a result of which the phase angle of 0° is indicated. The regulation device 7 then switches to the normal operating phase, which starts from a stabilized state. The regulation device 7 then carries out regulation in accordance with the method described above.

If the input signal is leading at the start of the initial transient process, the phase angle is first of all increased in the direction of 180° by increasing the delay in the variable delay unit 2. Since a leading input signal is defined by a phase angle between 0 and 180° and a lagging input signal is defined by a phase angle between 180 and 360°, a change from a leading input signal to a lagging input signal takes place when the input signal delay is increased continuously.

Let us assume that the phase signal has a logic "1" state for a lead and a logic "0" state for a lag. The two states may, of course, also be coded in a different manner, for example in opposite form, for the purposes of the invention. The regulation device would then identify a change of the phase signal P from a logic "1" to a logic "0" as a pass through 180°, and a change from a logic "0" to a logic "1" of the phase signal P as a pass through the phase angle of 0°. The change of the phase signal P from a logic "0" to a logic "1" accordingly leads to the initial transient process being ended, and to a transition to the steady-state operating phase.

However, when the phase angle is close to 180°, in the event of disturbances in the periodic input signal, for example in the case of a flank time offset resulting from jitter, it is possible for a lead to be indicated once again after the identification of the phase angle transition at 180°. The change from a logic "0" to a logic "1" of the phase signal can then lead to incorrect identification of the phase transition at a phase angle of 0°.

In order to avoid this, a filter circuit 8 is provided, to whose input the phase signal P is applied, and whose output is connected to a second input of the demultiplexer device 6. The output of the filter circuit 8 is connected to the input of the regulation device 7 during the initial transient phase, via the demultiplexer device 6 which is controlled by the regulation device.

The function of the filter circuit 8 is to filter disturbances on the flanks of the input signal, which are reflected in a state change in the phase signal.

The filter circuit 8 is designed such that a filtered phase signal FP indicates a state change only when the phase signal P indicates that the state is not the same as the filtered phase signal successively for a number of signal cycles. If the initial transient process starts with a lead, then the phase signal based on the example chosen above is a logic "1". The filtered phase signal also has the state of a logic "1". If the phase signal now changes to a logic "0", then the filtered phase signal does not change until the phase signal is a logic "0", successively for a number of signal cycles.

The number of signal cycles for which the phase signal must have the same states in order to produce a signal change in the filtered phase signal can essentially be chosen as required. The number of signal cycles is preferably chosen to be sufficiently large that no state change can be output via the filtered phase signal FP in the time period between the arrival of a disturbed flank of the input signal and the time when the disturbed flank of the input signal reaches the second input of the regulation unit 3 via the delay unit 2 and the delay element 4. This means that, if the delay between the delay unit 2 and the phase element 4 is three clock cycles, then the number of signal cycles for which the phase signal indicates a change in the state is at least three.

The number of signal cycles should not, however, be chosen to be excessively high either since this would result, in the event of a phase transition at a phase angle of 0°, in a risk of the delay unit 2 still increasing the delay for a time so that, on switching to the steady-state operating phase, a longer time would be required for the regulation unit 3 to reduce the delay of the variable delay unit 2 in order to reach a phase angle of 0°. Filtering over an excessively large number of signal cycles then therefore leads to the initial transient phase being lengthened.

Figure 2:
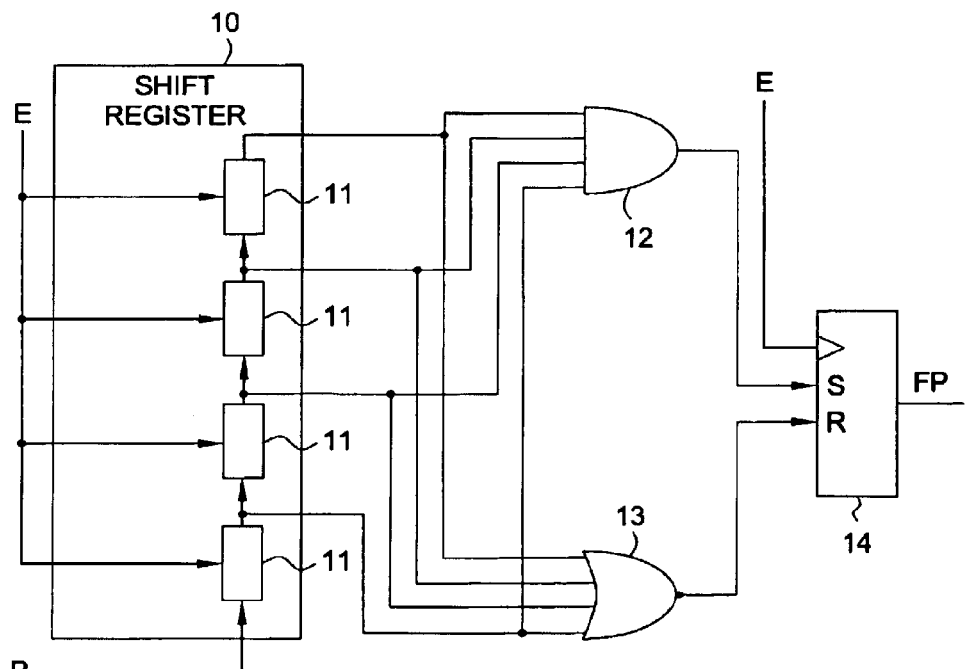
FIG. 2 shows one possible embodiment of a filter circuit.

FIG. 2 shows a block diagram of one possible embodiment of the filter circuit 8. The phase signal P is applied to a shift register 10, which has four register stores 11 which are connected in series. Each of the register stores 11 has a clock input to which the input signal is applied. The input signal state changes result in the applied phase signal P being passed in steps through the register stores 11 in the shift register 10. In the case of a shift register 10 with four register stores 11, this means that a phase signal has reached the output of the last register store 11 after four periods of the input signal. The number of register stores 11 in the shift register 10 is not restricted to four, but may be adapted depending on the number of signal cycles which are intended to be taken into account for filtering of the phase signal.

The outputs of the register stores 11 are each connected to inputs of an AND gate 12 and of a NOR gate 13, so that the successive states of the phase signal P which are stored in the register stores 11 are logically linked to one another in the AND gate 12 and in the NOR gate 13. One output of the AND gate 12 is connected to a set input of an SR flipflop 14. One output of the NOR gate 13 is connected to a reset input of the SR flipflop 14. The filtered phase signal FP is produced at the output of the SR flipflop. In order to clock the SR flipflop, it is likewise connected to the input signal at the input E of the DLL circuit 1.

When the phase signal P is in a logic "1" state, that is to say it is indicating an input signal lead, then a logic "1" is stored in each of the register stores 11 after four signal cycles. This means that a logic "1" is likewise produced at the output of the AND gate 12, and a logic "0" is produced at the output of the NOR gate 13. The set input of the SR flipflop 14 is therefore set to one, and is transferred to the SR flip-flop with the next flank. The filtered phase signal FP is then produced at the output of the SR flipflop 14. If the state of the phase signal P changes to a logic "0", then this state is transferred to the first register store 11 with the next corresponding flank of the input signal. This means that the output of the AND gate 12 assumes a logic "0", and that a logic "0" is likewise applied to the set input of the SR flipflop 14. This does not cause any change at the output of the SR flipflop 14. The reset input of the SR flipflop 14 is not set to a logic "1" via the output of the NOR gate 13 until logic zeros are stored in all of the register stores 11. When the next corresponding signal flank of the input signal occurs, this leads to a change in the state which is stored in the SR flipflop 14, and this is emitted at the output as the filtered phase signal FP.

If the state of the phase signal P changes only briefly to a logic "0" and then returns to a logic "1", then this does not lead to logic zeros being stored in all of the register stores 11, so that the SR flipflop 14 cannot be reset.

This means that brief disturbances in the periodic input signal resulting from jitter, resulting from sudden unintentional phase changes induced by noise, or resulting from regular phase disturbances do not lead to the possibility of incorrect identification of a transition from a lead to a lag, or vice-versa.

While the foregoing is directed to embodiments of the present invention, other and further embodiments of the invention may be devised without departing from the basic scope thereof, and the scope thereof is determined by the claims that follow.

What is claimed is:

1. A delay locked loop (DLL) circuit for phase matching of a periodic input signal, comprising:
   a variable delay unit;
   a delay element;
   a regulation unit having a regulation device for setting an input signal delay in the delay unit and a comparator unit for generating a phase signal in each signal cycle, wherein the state of the phase signal indicates a lead-lag relation between the input signal and a delayed signal which has been delayed by the variable delay unit and the delay element, the phase signal is provided to the regulation device during a steady-state operating phase, and the regulation device adjusts the delay of the variable delay unit during an initial transient phase until a change in the sate of the phase signal is detected indicating a change in the lead-lag relation between the input signal and the delayed signal; and
   a filter circuit for providing a filtered phase signal to the regulation device during the initial transient phase, wherein the filter circuit changes the state of the filtered phase signal to the state of the phase signal only when a different state of the phase signal with respect to the state of the filtered phase signal has been detected for a predetermined number of successive signal cycles.

2. The DLL circuit of claim 1, wherein the predetermined number of successive signal cycles is variable.

3. The DLL circuit of claim 2, wherein the predetermined number of successive signal cycles is chosen such that the signal delay between the input signal and the delayed signal is less than the multiple of the signal cycle time by the predetermined number.

4. The DLL circuit of claim 1, wherein the predetermined number of successive signal cycles is 4.

5. The DLL circuit of claim 1, wherein the regulation device varies the delay of the variable delay unit incrementally, with the increments being greater during the initial transient phase than during the steady-state operating phase.

6. The DLL circuit of claim 1, wherein the regulation device increases the delay of the variable delay unit incrementally during the initial transient phase until a change in the phase signal indicates a change from the input signal lagging the delayed signal to the input signal leading the delayed signal.

7. The DLL circuit of claim 1, wherein the filter circuit comprises a shift register having a predetermined number of register stores, the phase signal is applied to an input of the shift register, and the filtered phase signal changes state only when a different state than the state of the phase signal is stored in all of the shift registers.

8. The DLL circuit of claim 7, wherein the filter circuit comprises an SR flip-flop having a set input connected to the output of an AND gate and a reset input connected to the output of a NOR gate, with the outputs of the register stores in the shift register connected to inputs of the AND gate and to inputs of the NOR gate.

9. A method for phase matching of a periodic input signal during an initial transient phase, comprising:
   generating a phase signal with each cycle of the input signal, wherein a state of the phase signal indicates whether the input signal is leading or lagging a delayed signal;
   varying a delay of the delayed signal based on the state of the phase signal, wherein the delay of the delayed signal is varied incrementally during the initial transient phase; and
   transitioning from the initial transient phase to a steady-state operating phase when a change in the phase signal indicates a phase angle of 0° between input and delayed signals, wherein the phase signal is filtered during the initial transient phase and the state of the filtered phase signal changes only when a different state of the phase signal with respect to the state of the filtered phase signal has been detected for a predetermined number of successive signal cycles.

10. The method of claim 9, wherein the delay of the delayed signal during the initial transient phase is increased incrementally until it is identified that the input signal has changed from an identified lag to a lead with respect to the delayed signal.

11. The method of claim 9, comprising:
    varying the delay of the delayed signal using a first increment during the initial transient phase; and
    varying the delay of the delayed signal using a second increment during the steady-state operating phase, wherein the second increment is larger than the first increment.

12. The method of claim 9, wherein the state of the filtered phase signal changes only when a different state of the phase signal with respect to the state of the filtered phase signal has been detected for a predetermined number of successive signal cycles, wherein the predetermined number of successive signal cycles is chosen such that the signal delay between the input signal and the delayed signal is less than the multiple of the signal cycle time by the predetermined number.

13. The method of claim 9, comprising generating the filtered phase signal by logically ANDing shift register outputs indicative of the phase signal during multiple successive signal cycles.

14. The method of claim 13, comprising generating the filtered phase signal by logically NORing the shift register outputs.

15. The method of claim 14, comprising setting an SR flip-flop with a signal indicative of the logical ANDing and resetting the SR flip-flop with a signal indicative of the logical NORing.

16. An integrated circuit (IC) device, comprising:
    a clock signal line for carrying a clock signal; and
    a delay locked loop (DLL) circuit for compensating for propagation time delay of the clock signal, the DLL circuit having
      a delay unit and variable delay element for generating a delayed signal from the clock signal,
      a regulation circuit for adjusting the variable delay element, and a comparator unit for generating a phase signal in each signal cycle, wherein the state of the phase signal indicates a lead-lag relation between the clock signal and the delayed signal, the phase signal is provided to the regulation device during a steady-state operating phase, and the regulation device adjusts the delay of the variable delay unit during an initial transient phase until a change in the sate of the phase signal is detected indicating a change in the lead-lag relation between the clock signal and the delayed signal, and a filter circuit for providing a filtered phase signal to the regulation device during the initial transient phase, wherein the filter circuit changes the state of the filtered phase signal to the state of the phase signal only when a different state of the phase signal with respect to the state of the filtered phase signal has been detected for a predetermined number of successive clock signal cycles.

17. The IC device of claim 16, wherein the predetermined number of successive signal cycles is chosen such that the signal delay between the clock signal and the delayed signal is less than the multiple of the clock signal cycle time by the predetermined number.

18. The IC device of claim 16, wherein the regulation device of the DLL varies the delay of the variable delay unit incrementally, with the increments being greater during the initial transient phase than during the steady-state operating phase.

19. The IC device of claim 16, wherein the regulation device of the DLL increases the delay of the variable delay unit incrementally during the initial transient phase until a change in the phase signal indicates a change from the clock signal lagging the delayed signal to the clock signal leading the delayed signal.

20. The IC device of claim 16, wherein the filter circuit of the DLL comprises a shift register having a predetermined number of register stores, wherein the phase signal is applied to an input of the shift register and the filtered phase signal changes state only when a different state than the state of the phase signal is stored in all of the shift registers.

* * * * *